US009525054B2

(12) United States Patent
Chiang et al.

(10) Patent No.: US 9,525,054 B2
(45) Date of Patent: Dec. 20, 2016

(54) HIGH ELECTRON MOBILITY TRANSISTOR AND METHOD OF FORMING THE SAME

(71) Applicant: Taiwan Semiconductor Manufacturing Company, Ltd., Hsin-Chu (TW)

(72) Inventors: Chen-Hao Chiang, Jhongli (TW); Po-Chun Liu, Hsin-Chu (TW); Han-Chin Chiu, Kaohsiung (TW); Chi-Ming Chen, Zhubei (TW); Chung-Yi Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/734,399

(22) Filed: Jan. 4, 2013

(65) Prior Publication Data

US 2014/0191240 A1   Jul. 10, 2014

(51) Int. Cl.
*H01L 29/788* (2006.01)
*H01L 29/66* (2006.01)
(Continued)

(52) U.S. Cl.
CPC ..... *H01L 29/7783* (2013.01); *H01L 29/66462* (2013.01); *H01L 29/66522* (2013.01);
(Continued)

(58) Field of Classification Search
CPC .. H01L 29/2003; H01L 29/201; H01L 29/205; H01L 29/66462; H01L 29/778; H01L 29/7783; H01L 21/02458; H01L 21/0251; H01L 21/0254; H01L 29/66522; H01L 29/66621; H01L 29/41766
(Continued)

(56) References Cited

U.S. PATENT DOCUMENTS 6,593,193 B2 *   7/2003   Nishii et al. ............... 438/285
6,727,531 B1 *   4/2004   Redwing et al. .......... 257/194
(Continued)

FOREIGN PATENT DOCUMENTS

JP   2011009493   1/2011
JP   2011044647   3/2011
(Continued)

OTHER PUBLICATIONS

Pelá, R. R. and Caetano, C. and Marques, M. and Ferreira, L. G. and Furthmüller, J. and Teles, L. K., "Accurate band gaps of AlGaN, InGaN, and AlInN alloys calculations based on LDA-1/2 approach," Applied Physics Letters, 98, 151907 (2011), DOI:http://dx.doi.org/10.1063/1.3576570.*
(Continued)

*Primary Examiner* — Fernando L Toledo
*Assistant Examiner* — Christine L Hagan
(74) *Attorney, Agent, or Firm* — Slater Matsil, LLP

(57) ABSTRACT

A High Electron Mobility Transistor (HEMT) includes a first III-V compound layer having a first band gap, and a second III-V compound layer having a second band gap over the first III-V compound layer. The second band gap is smaller than the first band gap. The HEMT further includes a third III-V compound layer having a third band gap over the second III-V compound layer, wherein the third band gap is greater than the first band gap. A gate electrode is formed over the third III-V compound layer. A source region and a drain region are over the third III-V compound layer and on opposite sides of the gate electrode.

20 Claims, 6 Drawing Sheets

(51) Int. Cl.
*H01L 21/02* (2006.01)
*H01L 29/20* (2006.01)
*H01L 29/12* (2006.01)
*H01L 29/778* (2006.01)

(52) U.S. Cl.
CPC ...... *H01L 21/0254* (2013.01); *H01L 21/0262* (2013.01); *H01L 21/02458* (2013.01); *H01L 29/122* (2013.01); *H01L 29/2003* (2013.01)

(58) Field of Classification Search
USPC ......... 257/190–192, 200, 201; 438/285, 590, 438/936
See application file for complete search history.

(56) References Cited

U.S. PATENT DOCUMENTS

| | | | |
|---|---|---|---|
| 7,838,904 B2* | 11/2010 | Nakazawa et al. | 257/194 |
| 8,008,771 B2 | 8/2011 | Kim et al. | |
| 2003/0213975 A1* | 11/2003 | Hirose et al. | 257/194 |
| 2006/0226442 A1* | 10/2006 | Zhang et al. | 257/192 |
| 2007/0018199 A1* | 1/2007 | Sheppard et al. | 257/200 |
| 2007/0164322 A1* | 7/2007 | Smith et al. | 257/256 |
| 2008/0006845 A1* | 1/2008 | Derluyn | H01L 29/7787 257/192 |
| 2009/0194791 A1* | 8/2009 | Kanamura | H01L 29/42368 257/192 |
| 2010/0025730 A1* | 2/2010 | Heikman et al. | 257/194 |
| 2011/0084311 A1* | 4/2011 | Nelson et al. | 257/201 |
| 2011/0108885 A1 | 5/2011 | Sazawa et al. | |
| 2011/0140169 A1* | 6/2011 | Briere | H01L 21/28587 257/192 |

FOREIGN PATENT DOCUMENTS

| | | |
|---|---|---|
| KR | 20090018442 | 2/2009 |
| KR | 20090120215 | 11/2009 |
| KR | 1020100034919 | 4/2010 |
| KR | 20100131180 | 12/2010 |
| KR | 1020100138871 | 12/2010 |

OTHER PUBLICATIONS

Simin, G.; Koudymov, A.; Fatima, H.; Jianping Zhang; Yang, J.; Khan, M. Asif; Hu, X.; Tarakji, A.; Gaska, R.; Shur, M.S., "SiO/sub 2//AlGaN/InGaN/GaN MOSDHFETs," Electron Device Letters, IEEE, vol. 23, No. 8, pp. 458,460, Aug. 2002 doi: 10.1109/LED.2002.801316.*

Simin, G.; Hu, X.; Tarakji, A.; Zhang, J.; Koudymov, A.; Saygi, S.; Yang, J.; Khan, A.; Shur, M.S.; Gaska, R., "AlGaN/InGaN/GaN Double Heterostructure Field-Effect Transistor," Jpn. J. Appl. Phys. vol. 40 (2001) pp. L 1142-L 1144.*

Soltani et al. "Development and analysis of low resistance ohmic contact to n-AlGaN/GaN HEMT," Diamond & Related Materials 16 (2007), pp. 262-266; doi: 10.1016/j.diamond.2006.06.022.*

Arulkumaran, S., et al., "Low Specific On-Resistance AlGaN/AlN/GaN High Electron Mobility Transistors on High Resistivity Silicon Substrate," Electrochemical and Solid-State Letters, 2010, vol. 13, Issue 5, 5 pgs.

Kelekci, O., et al., "Numerical optimization of In-mole fractions and layer thicknesses in $Al_xGa_{1-x}N$/AlN/GaN high electron mobility transistors with InGaN back barriers," Physica B 406, 2011, pp. 1513-1518, Elsevier.

Shioda, T., et al., "Enhanced light output power of green LEDs employing AlGaN interlayer in InGaN/GaN MQW structure on sapphire (0001) substrate," Phys. Status Solidi A 209, No. 3, pp. 473-476, 2012, Wiley Online Library.

* cited by examiner

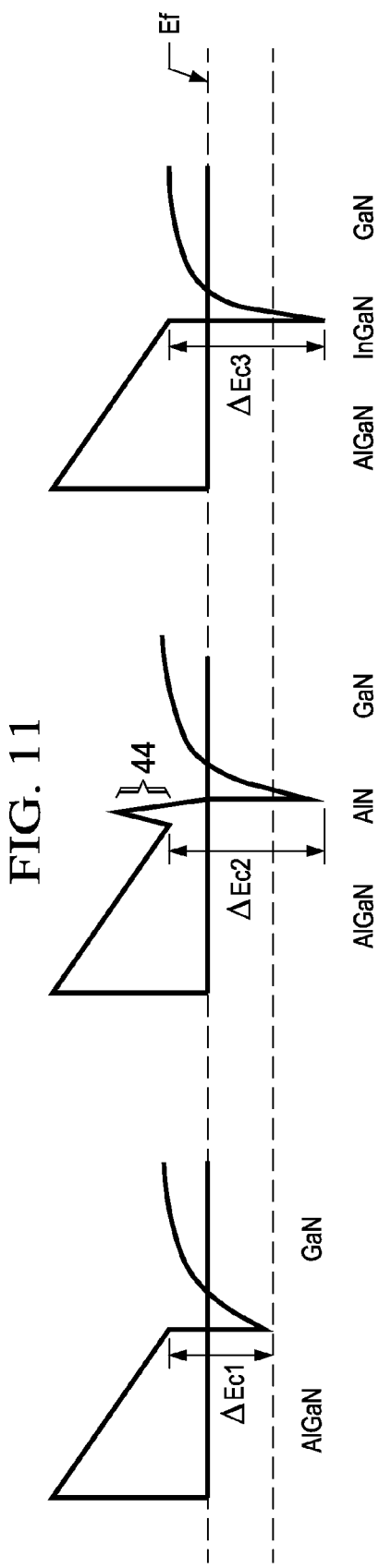

HIGH ELECTRON MOBILITY TRANSISTOR AND METHOD OF FORMING THE SAME

BACKGROUND

In semiconductor technology, due to the high mobility values, Group III-Group V (or III-V) semiconductor compounds are used to form various integrated circuit devices, such as high power field-effect transistors, high frequency transistors, and High Electron Mobility Transistors (HEMTs). A HEMT is a field effect transistor incorporating a very thin layer close to the junction between two materials with different band gaps (i.e., a heterojunction). The thin layer, instead of a doped region as is generally the case for Metal Oxide Semiconductor Field Effect Transistors (MOSFETs), acts as the channel. In contrast with the MOSFETs, the HEMTs have a number of attractive properties including high electron mobility, the ability to transmit signals at high frequencies, etc.

The thin layer that forms the channel of a HEMT includes highly mobile conducting electrons with very high densities, giving the channel a very low resistivity. The thin layer is known as a Two-Dimensional Electron Gas (2DEG). The performance of the HEMT is closely related to the carrier density in the 2DEG, and the higher the carrier density is, the better the performance may be obtained.

BRIEF DESCRIPTION OF THE DRAWINGS

For a more complete understanding of the embodiments, and the advantages thereof, reference is now made to the following descriptions taken in conjunction with the accompanying drawings, in which:

FIG. 11 illustrates the comparison of band diagrams of various structures.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A High Electron Mobility Transistor (HEMT) and the method of forming the same are provided in accordance with various exemplary embodiments. The intermediate stages of forming the HEMT are illustrated. The variations of the embodiments are discussed. Throughout the various views and illustrative embodiments, like reference numbers are used to designate like elements. The process for forming the HEMT may be found referring to the exemplary process flow 100 shown in FIG. 10. Additional process steps may be provided before, during, or after process 100 in FIG. 10. Various figures have been simplified for a better understanding of the concepts of the present disclosure.

Figure 1:
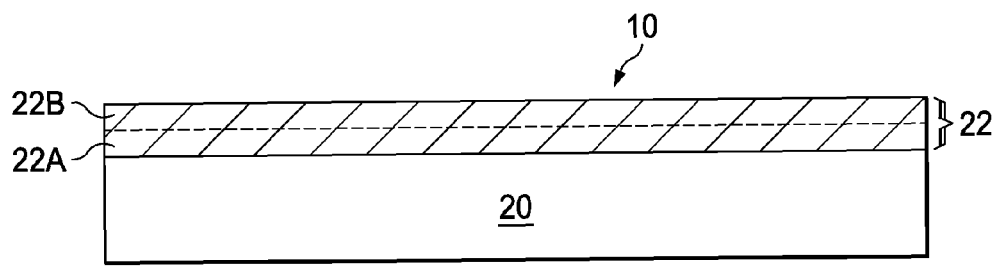
FIGS. 1 through 9 are cross-sectional views of intermediate stages in the manufacturing of a High Electron Mobility Transistor (HEMT) in accordance with some exemplary embodiments.

FIGS. 1 through 9 illustrate the cross-sectional views of intermediate stages in the formation of an HEMT in accordance with exemplary embodiments. Referring to FIG. 1, which is a cross-sectional view of a portion of substrate 20, substrate 20 may be a part of wafer 10. In some embodiments, substrate 20 includes a silicon carbide (SiC) substrate, a sapphire substrate, a silicon substrate, or the like. Substrate 20 may be a bulk substrate formed of a bulk material, or may be a composite substrate including a plurality of layers that are formed of different materials.

In accordance with some embodiments, buffer layer 22 is first formed over substrate 20, which acts as the buffer and/or the transition layer for the subsequently formed overlying layers. The respective step is shown as step 101 in FIG. 10. Buffer layer 22 may be epitaxially grown using Metal Organic Vapor Phase Epitaxy (MOVPE). Buffer layer 22 may function as an interface to reduce lattice mismatch between substrate 20 and the subsequently formed III-V compound layers 26 (FIGS. 3) and 28 (FIG. 4). In some embodiments, buffer layer 22 includes an aluminum nitride (AlN) layer having a thickness in a range between about 10 nanometers (nm) and about 300 nm. Buffer layer 22 may include a single layer or a plurality of layers. For example, buffer layer 22 may include low-temperature AlN layer 22A formed at a temperature between about 950° C. and about 1,050° C., and high-temperature AlN layer 22B formed at a temperature between about 1,050° C. and about 1,150° C. In some embodiments, buffer layer 22A has a thickness in a range between about 10 nanometers (nm) and about 100 nm, and buffer layer 22B has a thickness in a range between about 100 nanometers (nm) and about 200 nm.

Figure 2:
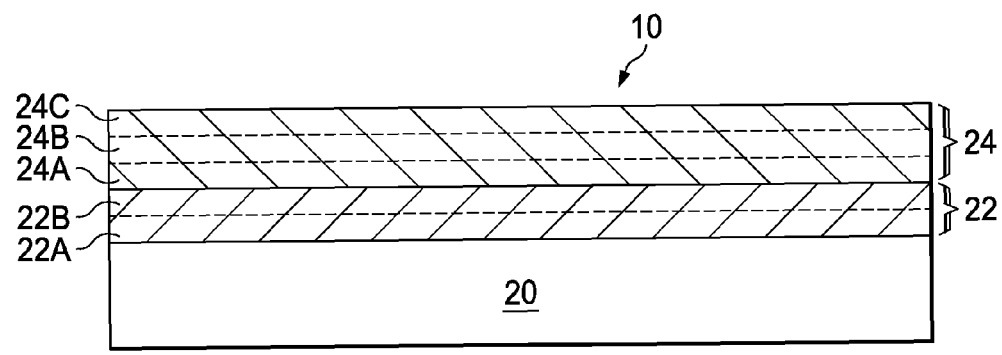

Referring to FIG. 2, III-V compound layer 24 is formed over buffer layer 22. The respective step is also shown as step 101 in FIG. 10. III-V compound layer 24 may also act as a buffer layer, and hence is referred to as buffer layer 24 hereinafter. Buffer layer 24 can be epitaxially grown using MOVPE, for example. Buffer layer 24 may include an aluminum gallium nitride (AlGaN) layer, which may have a thickness in a range from about 500 nm to about 1,000 nm. Buffer layer 24 may be a graded buffer layer, which means that the relative amounts of the respective aluminum and/or gallium content change with depth in the layer throughout a part or the total thickness of buffer layer 24. The relative amounts may change gradually to reduce the lattice parameter with the distance from substrate 20. For example, FIG. 2 schematically illustrated three sub layers 24A, 24B, and 24C, with the percentages of aluminum and/or gallium in sub layers 24A, 24B, and 24C different from each other. In some exemplary embodiments, sub layer 24A has an aluminum percentage between about 65 percent and about 85 percent, sub layer 24B has an aluminum percentage between about 35 percent and about 60 percent, and sub layer 24C has an aluminum percentage between about 10 percent and about 30 percent.

Figure 3:
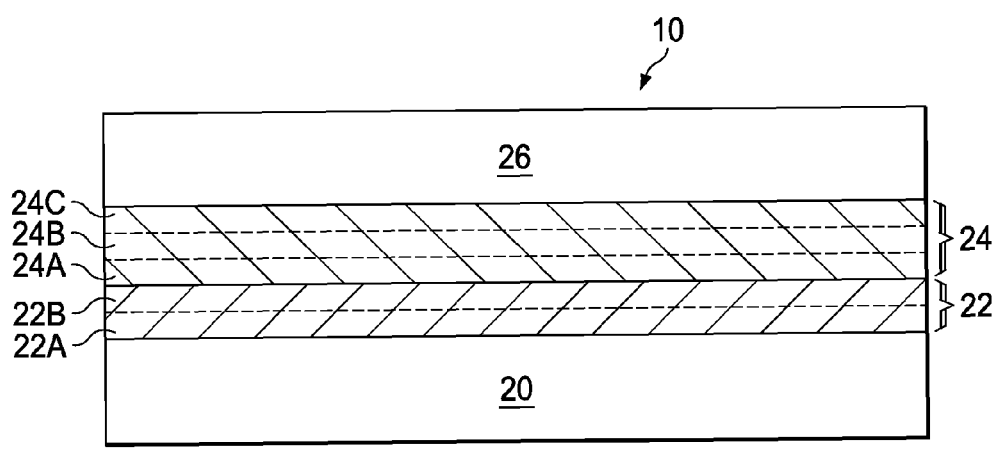
Figure 4:
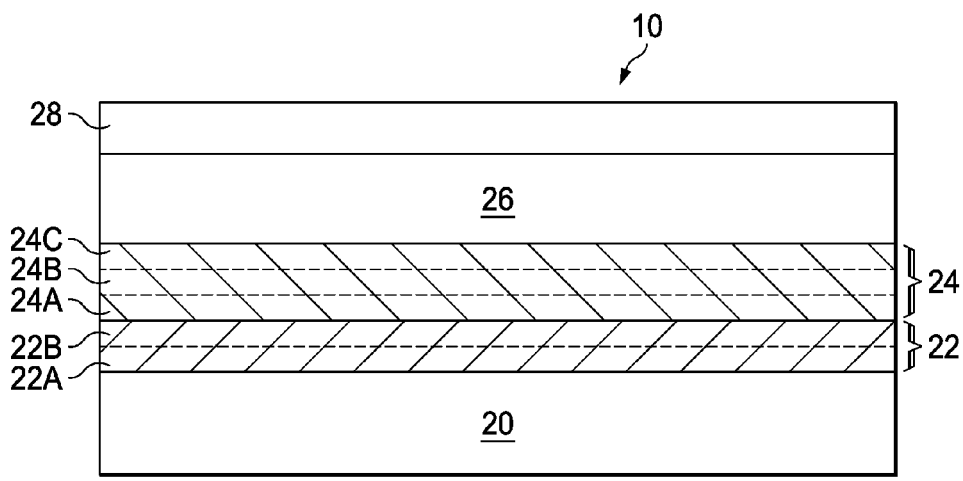
Figure 10:
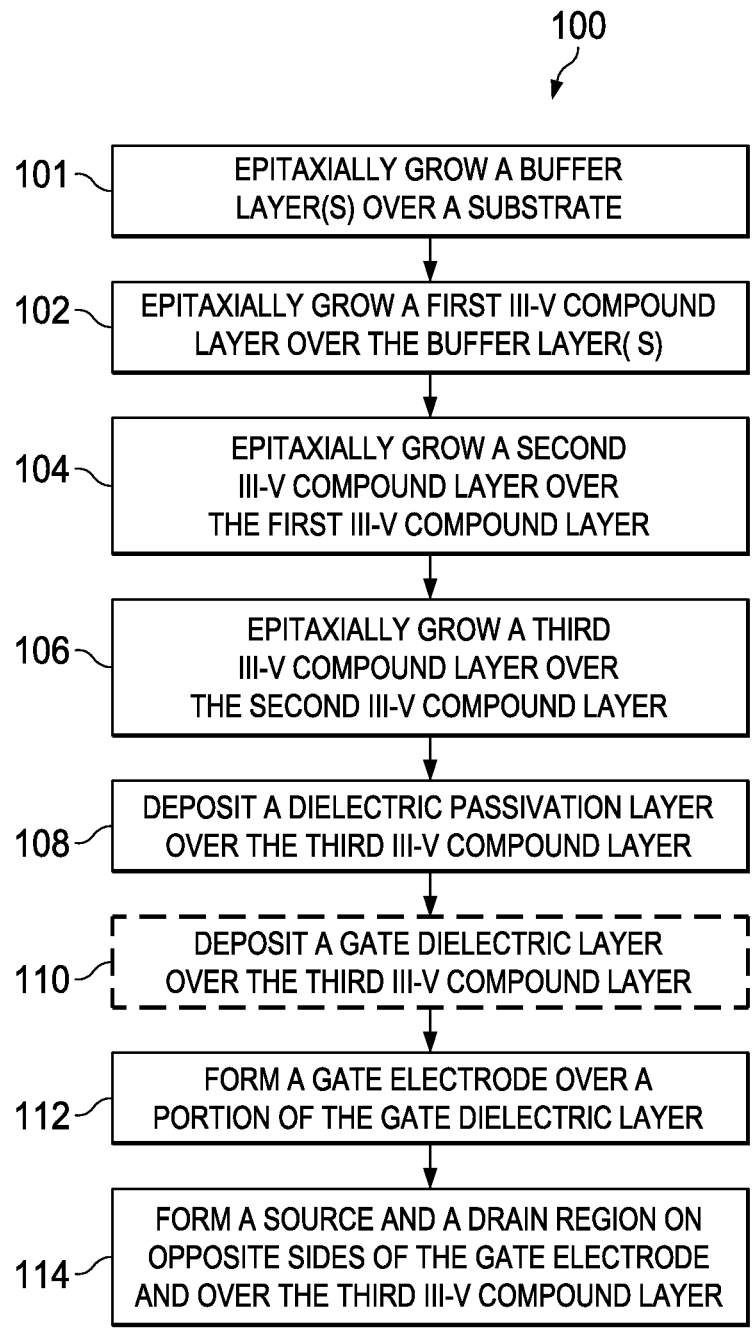
FIG. 10 illustrates a schematic process flow for forming the HEMT in accordance with exemplary embodiments.

Referring to FIG. 3, first III-V compound layer 26 is grown over buffer layer 24 (step 102 in FIG. 10). In some embodiments, III-V compound layer 26 is a gallium nitride (GaN) layer. GaN layer 26 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals. In some exemplary embodiments, III-V compound layer 26 has a thickness ranging from about 0.5 micron to about 10 microns. III-V compound layer 26 may also include GaAs or InP rather than GaN, or may include a GaAs layer or an InP layer. In some embodiments, III-V compound layer 26 may have a band gap between about 3.0 eV and about 3.5 eV, and may be, for example, about 3.4 eV when comprising GaN.

Figure 5:
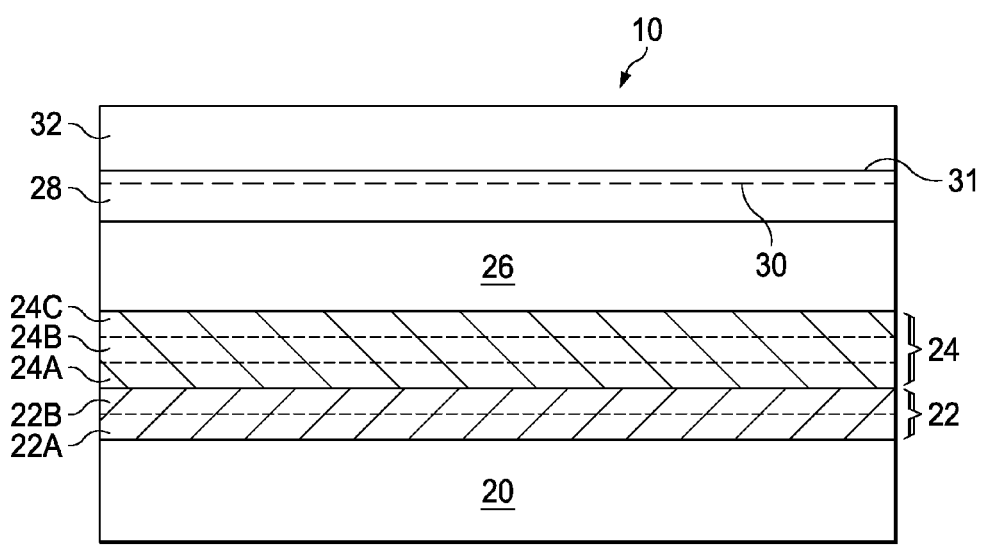

Referring to FIG. 4, a second III-V compound layer 28 is formed over, and may contact, III-V compound layer 26 (step 104 in FIG. 10). III-V compound layer 28 is formed of a III-V compound material having a band gap smaller than the band gaps of III-V compound layer 26 and the overlying III-V compound layer 32 (FIG. 5). In some embodiments, III-V compound layer 28 may have a band gap smaller than about 3.0 eV, and may be between about 2.6 eV and 2.8 eV. The exemplary material of III-V compound layer 28 may include InGaN. InGaN layer 28 may be epitaxially grown by using, for example, MOVPE, during which an indium-containing precursor, a gallium-containing precursor, and a nitrogen-containing precursor are used. The indium-containing precursor may include Trimethylindium (TMI), Triethylindium(TEI), or other suitable chemicals. The gallium-containing precursor and the nitrogen-containing precursor may be selected from the same candidate materials that are used for forming GaN layer 26. The atomic percent of indium affects the band gap, the conduction band, and the valence band of the resulting InGaN layer 28, and hence a proper percentage is selected in order to achieve desirable characteristics such as a desirable band gap. In some exemplary embodiments, the indium percentage in InGaN layer 28 may be greater than about 5 atomic percent, or greater than about 9 percent. The indium percentage may also be between about 9 percent and about 18 percent. The thickness of III-V compound layer 28 may range from about 1 nm to about 3 nm, although different thicknesses may be used. InGaN layer 28 may be undoped. Alternatively, InGaN layer 28 is unintentionally doped, such as lightly doped with n-type dopants due to a precursor used for forming InGaN layer 28.

Referring to FIG. 5, a third III-V compound 32, which is a donor-supply layer, is grown on, and may contact, III-V compound layer 28. The respective step is shown as step 106 in FIG. 10. III-V compound layer 32 has a band gap greater than the band gaps of III-V compound layer 26 and III-V compound layer 28. An interface 31 is formed between III-V compound layer 28 and III-V compound layer 32. Carrier channel 30, which is known as a Two-Dimensional Electron Gas (2DEG), is formed and located in III-V compound layer 28 near interface 31. In some embodiments, III-V compound layer 32 is an AlGaN layer. In other embodiments, III-V compound layer 32 may include an AlGaAs layer, or AlInP layer. In some embodiments, III-V compound layer 32 has a band gap greater than about 3.6 eV, and may be between about 3.8 eV and about 4.2 eV, for example, when comprising AlGaN.

III-V compound layer 32 may be epitaxially grown over III-V compound layer 28 through MOVPE. When formed of AlGaN, III-V compound layer 32 may be grown using an aluminum-containing precursor, a gallium-containing precursor, and a nitrogen-containing precursor. The aluminum-containing precursor may include trimethylaluminum (TMA), triethylaluminium (TEA), or other suitable chemical. The gallium-containing precursor and the nitrogen-containing precursor may be selected from the same candidate precursors used for forming GaN layer 26. In some exemplary embodiments, AlGaN layer 32 has a thickness ranging from about 10 nm to about 50 nm.

Figure 6:
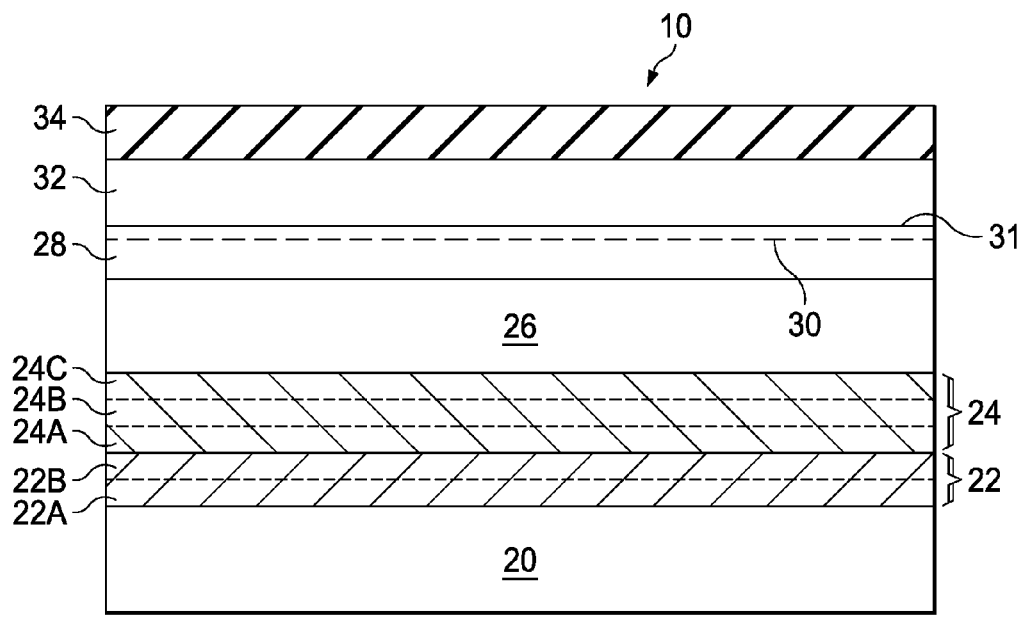

Next, as shown in FIG. 6, dielectric passivation layer 34 is deposited over, and may contact, a top surface of III-V compound layer 32 (step 108 in FIG. 10). In some exemplary embodiments, dielectric passivation layer 34 has a thickness in a range from about 100 Å to about 5,000 Å. An exemplary dielectric passivation layer 34 includes silicon oxide and/or silicon nitride. When comprising silicon nitride, dielectric passivation layer 34 may be formed by performing a Low-Pressure Chemical Vapor Deposition (LPCVD) method without plasma using $SiH_4$ and $NH_3$ gases. Dielectric passivation layer 34 protects the underlying III-V compound layer 32 from the damage from plasma, which plasma is generated in the following processes.

Figure 7:
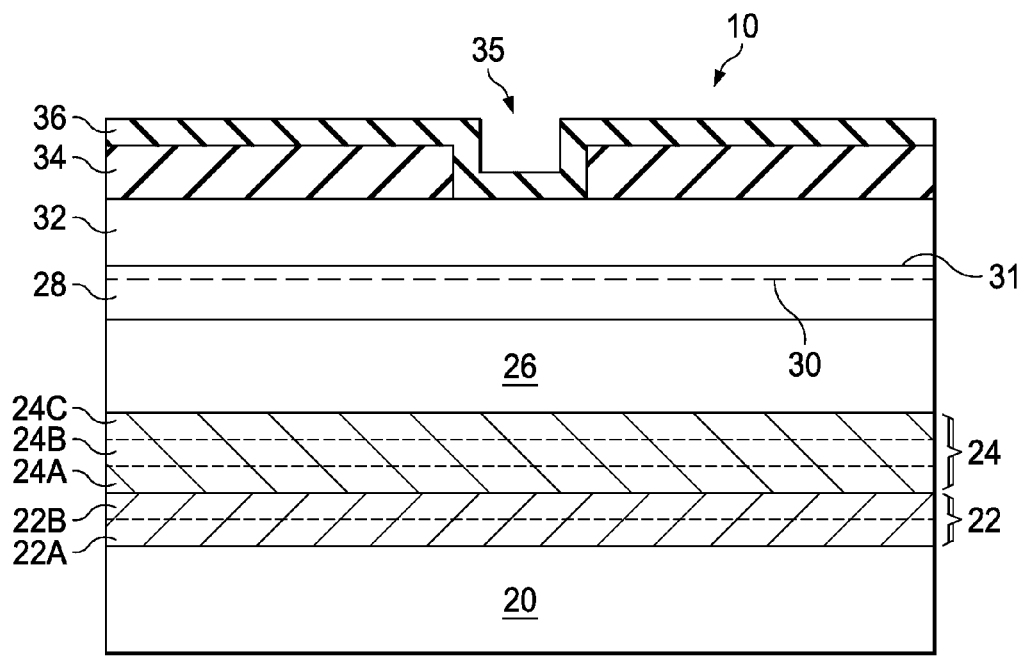

Next, referring to FIG. 7, opening 35 is formed in dielectric passivation layer 34, for example, through etching, to expose a portion of the top surface of AlGaN layer 32. In some examples, dielectric passivation layer 34 comprises silicon nitride, and opening 35 is etched in a dry etching environment including $BCl_3$, for example, as the etchant gas.

Further referring to 7, in some embodiments, gate dielectric layer 36 is deposited over dielectric passivation layer 34 (step 110 in FIG. 10). In alternative embodiments, no gate dielectric layer is formed, and hence step 110 in FIG. 10 is illustrated in a dashed box. Gate dielectric layer 36 also extends into opening 35, and hence includes a portion overlapping and contacting III-V compound layer 32. Furthermore, gate dielectric layer 36 includes portions on the sidewalls of dielectric passivation layer 34, and portions overlapping dielectric passivation layer 34. Gate dielectric layer 36 may increase the threshold voltage of the resulting HEMT 42 (FIG. 9) to a higher level, and prevent a leakage current from the respective gate electrode 38 (FIG. 9) to III-V compound layer 32. As a result, HEMT 42 could be operated under higher operation voltages for various applications.

In some embodiments, gate dielectric layer 36 has a thickness range from about 3 nm to about 50 nm. The exemplary materials of gate dielectric layer 36 may be selected from silicon oxide, silicon nitride, gallium oxide, aluminum oxide, scandium oxide, zirconium oxide, lanthanum oxide, hafnium oxide, and combinations thereof. In some embodiments, gate dielectric layer 36 is formed using Atomic Layer Deposition (ALD). In other embodiments, gate dielectric layer 36 is formed using Plasma Enhanced Chemical Vapor Deposition (PECVD) or Low-Pressure Chemical Vapor Deposition (LPCVD).

Figure 8:
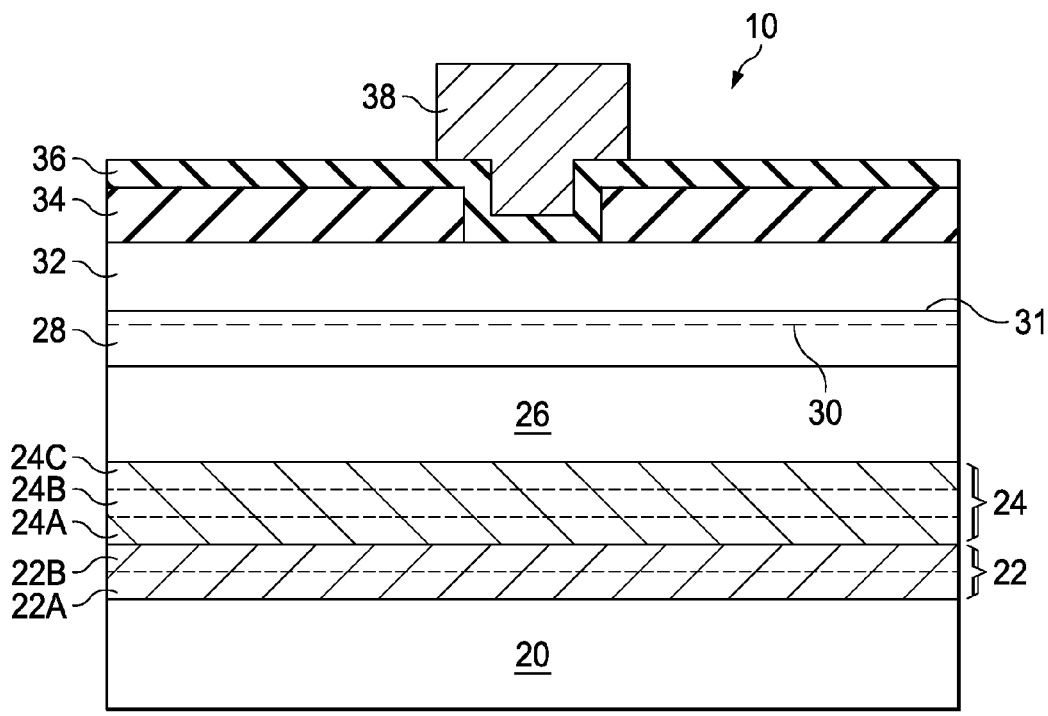

FIG. 8 illustrates a cross-sectional view the wafer 10 after the formation of gate electrode 38 over gate dielectric layer 36 (step 112 in FIG. 10). Gate electrode 38 comprises a portion extending into opening 35 (FIG. 7), and may further include portions overlapping dielectric passivation layer 34 and gate dielectric 36, if any. Gate dielectric layer 36 thus separates gate electrode 38 from dielectric passivation layer 34 and III-V compound layer 32. In some embodiments, the formation of gate electrode 38 includes depositing a blanket gate electrode layer over gate dielectric layer 36 and filling opening 35 shown in FIG. 7, and performing lithography and etching processes on the gate electrode layer to define gate electrode 38. In some embodiments, gate electrode 38 includes a conductive material layer that includes a refractory metal or the respective compounds including, e.g., titanium (Ti), titanium nitride (TiN), titanium tungsten (TiW), and tungsten (W). In other examples, gate electrode 38 includes nickel (Ni), gold (Au), copper (Cu), or the alloys thereof.

In above-described embodiments, gate dielectric layer 36 is formed. In alternative embodiments, gate dielectric layer 36 is omitted, and gate electrode 38 is in contact with III-V compound layer 32 and dielectric passivation layer 34. The resulting structure is essentially the same as the embodiments shown in FIG. 8, except gate dielectric layer 36 is not formed.

Figure 9:
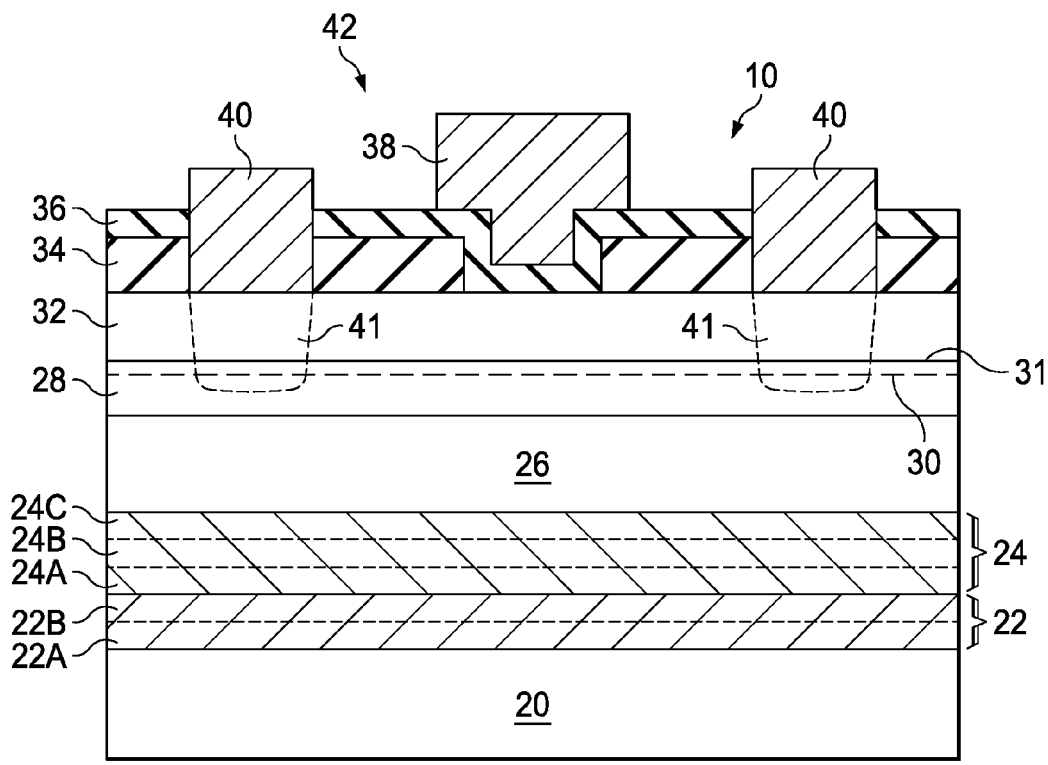

FIG. 9 illustrates a cross-sectional view of wafer 10 after metal features 40 are formed (step 114 in FIG. 10). Two openings (occupied by metal features 40) are formed on the opposite sides of gate electrode 38, for example, by lithography and etching processes performed on both gate dielectric layer 36 and dielectric passivation layer 34. Portions of III-V compound layer 32 on opposite sides of gate electrode 38 are thus exposed. In some exemplary formation process of metal features 40, a metal layer (not shown) is deposited over gate dielectric layer 36 (and dielectric passivation layer 34), which metal layer fills the openings in dielectric layer 36 and dielectric passivation layer 34. The metal layer further contacts III-V compound layer 32. A photoresist layer (not shown) is formed over the metal layer and then patterned. The patterned photoresist layer is then used as an etching mask to pattern the metal layer down to the underlying gate dielectric layer 36 or dielectric passivation layer 34. The remaining portions of the metal layer are metal features 40. The photoresist layer is removed after the formation of the metal features 40. Metal features 40 are configured as at least parts of the source and drain regions of the resulting HEMT 42. In the above described embodiments, gate dielectric 36, gate electrode 38, metal features 40, and carrier channel 30 form HEMT 42. When a voltage is applied to gate electrode 38, a device current may be modulated.

In some embodiments, metal features 40 include one or more conductive materials. For example, metal features 40 may comprise Ti, Co, Ni, W, Pt, Ta, Pd, Mo, TiN, an AlCu alloy, and alloys thereof. In other examples, each of metal features 40 includes a bottom Ti/TiN layer, an AlCu layer overlying the bottom Ti/TiN layer, and a top Ti layer overlying the AlCu layer. The formation methods of the metal layer include ALD or Physical Vapor Deposition (PVD) processes. In some embodiments, a thermal annealing process may be applied to metal features 40 such that metal features 40, III-V compound layer 32 and III-V compound layer 28 react to form an inter-metallic compound 41. The inter-metallic compound 41 (which also forms parts of the source and drain regions of HEMT 42) thus connects to the opposite ends of channel 30, and provides for more effective electrical connection to carrier channel 30.

A band gap discontinuity exists between III-V compound layer 32 and III-V compound layer 28, creating the very thin layer 30 of highly mobile conducting electrons in III-V compound layer 28. This thin layer 30 is referred to as a Two-Dimensional Electron Gas (2DEG), which is schematically illustrated. 2DEG 30 forms the carrier channel, which is the channel of HEMT 42. The carrier channel of 2DEG is located in III-V compound layer 28 and near interface 31 between III-V compound layer 32 and III-V compound layer 28. The carrier channel has high electron mobility partly because III-V compound layer 28 is undoped or unintentionally doped, and the electrons can move freely without collision or with substantially reduced collisions with impurities.

FIG. 11 schematically illustrates band diagrams of three sample structures, wherein the conduction bands of the three sample structures are compared. The first band diagram shows a first sample structure having a 2DEG formed between an AlGaN layer and a GaN layer. The second band diagram shows a second sample structure having a 2DEG formed between an AlGaN layer and a GaN layer, with an additional AlN layer inserted therebetween. The third band diagram shows a third sample structure having a 2DEG formed between an AlGaN layer and a GaN layer, with an additional InGaN layer inserted therebetween in accordance with the embodiments of the present disclosure. Comparing the first band diagram and the third band diagram, it is observed that band difference $\Delta Ec3$ of the third sample structure is greater than band difference $\Delta Ec1$, which means the confinement to electrons in the third sample structure is greater than in the first sample structure. By adjusting the indium percentage in the InGaN layer, band difference $\Delta Ec3$ may be adjusted to a desirable high level. Accordingly, the carrier mobility in the embodiments is greater than in the first sample structure. Similarly, the second band diagram (which includes an AlN layer between AlGaN and GaN layers) has an increased band difference $\Delta Ec2$ over band difference $\Delta Ec1$. However, AlN has a band gap significantly higher than that of GaN, and hence due to barrier 44 in the second band diagram, the Ohmic contact resistance between the metal features (corresponding to 40 in FIG. 9) that form the source and drain regions of the HEMT and the respective channel is high. Advantageously, in the third band diagram, there is no high barrier 44 that appears in the second band diagram. Accordingly, the HEMT in accordance with the embodiments of the present disclosure has a low contact resistance, a high carrier density, and a high mobility. The drive current of HEMT 42 in FIG. 9 is thus high.

In accordance with some embodiments, an HEMT includes a first III-V compound layer having a first band gap, and a second III-V compound layer having a second band gap over the first III-V compound layer. The second band gap is smaller than the first band gap. The HEMT further includes a third III-V compound layer having a third band gap over the second III-V compound layer, wherein the third band gap is greater than the first band gap. A gate electrode is formed over the third III-V compound layer. A source region and a drain region are over the third III-V compound layer and on opposite sides of the gate electrode.

In accordance with other embodiments, an HEMT includes a GaN layer, an InGaN layer over and contacting the GaN layer, an AlGaN layer over and contacting the InGaN layer, a dielectric passivation layer over the AlGaN layer, a gate electrode over the AlGaN layer, and a source region and a drain region over the AlGaN layer. The source region and the drain region are on opposite sides of the gate electrode. The source region and the drain region penetrate through the dielectric passivation layer to contact the AlGaN layer.

In accordance with yet other embodiments, a method of forming an HEMT includes epitaxially growing a first III-V compound layer having a first band gap, epitaxially growing a second III-V compound layer having a second band gap smaller than the first band gap over the first III-V compound layer, epitaxially growing a third III-V compound layer having a third band gap greater than the first band gap over the second III-V compound layer, forming a gate electrode over the III-V compound layer, and forming a source region and a drain region over the third III-V compound layer and on opposite sides of the gate electrode.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A High Electron Mobility Transistor (HEMT) comprising:
   a first III-V compound layer comprising gallium nitride;
   a second III-V compound layer over the first III-V compound layer, wherein the second III-V compound layer comprises indium gallium nitride;
   a third III-V compound layer over the second III-V compound layer, wherein the third III-V compound layer comprises aluminum gallium nitride, wherein the first III-V compound layer, the second III-V compound layer, and the third III-V compound layer are configured so that a Two-Dimensional Electron Gas (2DEG) is formed in the second III-V compound layer and close to an interface between the second III-V compound layer and the third III-V compound layer;
   a dielectric passivation layer disposed over the third III-V compound layer, with a bottom surface of the dielectric passivation layer contacting a first portion of a planar upmost top surface of the third III-V compound layer;
   a gate dielectric comprising:
      a first portion overlapping a portion of the dielectric passivation layer; and
      a second portion extending into the dielectric passivation layer, wherein a lowest bottom surface of the gate dielectric is coplanar with and contacting a second portion of the planar upmost top surface of the third III-V compound layer, wherein both the first portion and the second portion of the gate dielectric are formed of a single layer;
   a gate electrode over and contacting the gate dielectric; and
   a source region and a drain region over the third III-V compound layer and on opposite sides of the gate electrode, wherein the source region and the drain region penetrate through the dielectric passivation layer and the third III-V compound layer, wherein the dielectric passivation layer laterally surrounds each of the source region and the drain region, the gate dielectric and the dielectric passivation layer both extend from a first side to an opposite second side of one of the source region and the drain region, and the gate dielectric extends continuously from the source region to the drain region.

2. The HEMT of claim 1, wherein the first III-V compound layer has a first band gap, the second III-V compound layer has a second band gap smaller than the first band gap, and wherein the third III-V compound layer has a third band gap greater than the first band gap.

3. The HEMT of claim 1, wherein one of the source region and the drain region comprises a top surface higher than all top surfaces of the dielectric passivation layer, and a bottom surface lower than all bottom surfaces of the dielectric passivation layer.

4. The HEMT of claim 1, wherein the source region and the drain region penetrate through the 2DEG.

5. The HEMT of claim 4, wherein one of the source region and the drain region comprises:
   a metal portion over the third III-V compound layer; and
   an inter-metallic compound comprising a compound, with the compound comprising a metal in the metal portion and the third III-V compound layer, wherein the inter-metallic compound joins a bottom of the one of the source region and the drain region, and the inter-metallic compound penetrates through the 2DEG.

6. The HEMT of claim 1, wherein the planar upmost top surface of the third III-V compound layer is planar between the source region and the drain region.

7. The HEMT of claim 1, wherein portions of the upmost top surface of the third III-V compound layer contacting both the dielectric passivation layer and the gate dielectric are coplanar.

8. A High Electron Mobility Transistor (HEMT) comprising:
   a gallium nitride (GaN) layer;
   an indium gallium nitride (InGaN) layer over and contacting the GaN layer;
   an aluminum gallium nitride (AlGaN) layer over and contacting the InGaN layer;
   a dielectric passivation layer over the AlGaN layer;
   a gate dielectric formed of a single layer, the gate dielectric comprising a portion overlapping and contacting the AlGaN layer, wherein the portion of the gate dielectric extends from a top surface of the dielectric passivation layer to stop at a bottom surface of the dielectric passivation layer, and the gate dielectric does not extend into the AlGaN layer;
   a gate electrode over and contacting the gate dielectric;
   a source region and a drain region over the AlGaN layer, wherein the source region and the drain region are on opposite sides of the gate electrode, wherein the source region and the drain region penetrate through the dielectric passivation layer and the third III-V compound layer, wherein the dielectric passivation layer laterally surrounds each of the source region and the drain region, the gate dielectric and the dielectric passivation layer both extend from a first side to an opposite second side of one of the source region and the drain region, and the gate dielectric extends continuously from the source region to the drain region and wherein the source region and the drain region comprise:
      metal portions over the AlGaN layer, wherein the metal portions penetrate through the dielectric passivation layer, with top portions of the metal portions higher than entireties of the dielectric passivation layer; and
      inter-metallic compounds underlying and joined to the respective ones of the metal portions, wherein the inter-metallic compounds extend into the AlGaN layer and the InGaN layer, wherein one of the inter-metallic compounds extends from a top surface of the AlGaN layer to a level below a bottom surface of the AlGaN layer.

9. The HEMT of claim 8, wherein the gate dielectric comprises an edge contacting an edge of one of the source region and the drain region.

10. The HEMT of claim 9, wherein the gate dielectric further comprises:
   a first portion over the dielectric passivation layer, wherein the source region and the drain region penetrate through the first portion of the gate dielectric; and a second portion in an opening in the dielectric passivation layer, wherein the second portion spaces the gate electrode apart from the AlGaN layer.

11. The HEMT of claim 9, wherein the dielectric passivation layer comprises portions on opposite sides of, and contacting opposite sidewalls of, one of the source region and the drain region.

12. The HEMT of claim 8, wherein the atomic percentage of indium in the InGaN layer is between 9 percent and 18 percent.

13. The HEMT of claim 8 further comprising:
a buffer layer underlying the GaN layer; and
a substrate underlying the buffer layer.

14. The HEMT of claim 8, wherein a lowest bottom surface of the gate dielectric is coplanar with and contacting the top surface of the AlGaN layer.

15. The HEMT of claim 14, wherein the lowest bottom surface of the gate dielectric is substantially level with a bottom surface of the dielectric passivation layer.

16. A High Electron Mobility Transistor (HEMT) comprising:
a first III-V compound layer comprising gallium nitride;
a second III-V compound layer over the first III-V compound layer, wherein the second III-V compound layer comprises indium gallium nitride;
a third III-V compound layer over the second III-V compound layer, wherein the third III-V compound layer comprises aluminum gallium nitride, wherein the first III-V compound layer, the second III-V compound layer, and the third III-V compound layer are configured to form a Two-Dimensional Electron Gas (2DEG) in the second III-V compound layer;
a dielectric passivation layer over the third III-V compound layer;
a dielectric layer formed of a single layer, the dielectric layer comprising:
a first portion penetrating through the dielectric passivation layer, wherein the first portion is configured to be a gate dielectric of the HEMT, with an entirety of the dielectric layer being higher than the third III-V compound layer, and a lowest bottom surface of the dielectric layer is coplanar with and contacting a top surface of the third III-V compound layer; and
a second portion over the dielectric passivation layer;
a gate electrode over and contacting the first portion of the dielectric layer; and
a source region and a drain region over the third III-V compound layer, wherein the dielectric passivation layer comprises portions on opposite sides of each of the source region and the drain region, wherein the dielectric passivation layer comprises edges contacting opposite edges of each of the source region and the drain region, the dielectric layer and the dielectric passivation layer both extend from a first side to an opposite second side of each of the source region and the drain region, and the gate dielectric extends continuously from the source region to the drain region.

17. The HEMT of claim 16, wherein each of the source region and the drain region penetrates through the third III-V compound layer.

18. The HEMT of claim 17, wherein each of the source region and the drain region further penetrates through the 2DEG.

19. The HEMT of claim 18, wherein one of the source region and the drain region comprises:
a metal portion over the third III-V compound layer, wherein the metal portion comprises a top portion over the dielectric passivation layer; and
an inter-metallic compound joined to a bottom of the one of the source region and the drain region, wherein the inter-metallic compound penetrates through the 2DEG.

20. The HEMT of claim 16, wherein the first portion of the dielectric layer comprises a bottom surface substantially level with a bottom surface of the dielectric passivation layer.

* * * * *